United States Patent
Eun et al.

(10) Patent No.: US 8,102,951 B2
(45) Date of Patent: Jan. 24, 2012

(54) APPARATUS AND METHOD FOR CONTROLLING ITERATIVE DECODING IN A MOBILE COMMUNICATION SYSTEM

(75) Inventors: Yoo-Chang Eun, Seoul (KR); In-Hyoung Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 650 days.

(21) Appl. No.: 12/260,040

(22) Filed: Oct. 28, 2008

(65) Prior Publication Data
US 2009/0110122 A1   Apr. 30, 2009

(30) Foreign Application Priority Data
Oct. 30, 2007 (KR) .................. 10-2007-0109402

(51) Int. Cl.
*H04L 27/06* (2006.01)
(52) U.S. Cl. .......................................... 375/340
(58) Field of Classification Search .................. 375/262, 375/265, 340, 316, 341; 714/791, 794, 795
See application file for complete search history.

(56) References Cited

U.S. PATENT DOCUMENTS

| | | | | |
|---|---|---|---|---|
| 6,526,531 B1* | 2/2003 | Wang | .............................. | 714/704 |
| 6,944,803 B2* | 9/2005 | Hunt | .............................. | 714/701 |
| 7,254,190 B2* | 8/2007 | Kwentus et al. | .............. | 375/340 |
| 7,765,453 B2* | 7/2010 | Duggan | ........................ | 714/755 |
| 7,895,506 B2* | 2/2011 | Bhora et al. | ................... | 714/794 |

FOREIGN PATENT DOCUMENTS

| | | | |
|---|---|---|---|
| KR | 10-2007-0095572 A | | 10/2007 |
| WO | 2007/001304 A1 | | 1/2007 |
| WO | 2007/001305 A1 | | 1/2007 |

\* cited by examiner

*Primary Examiner* — Sam K Ahn
(74) *Attorney, Agent, or Firm* — Jefferson IP Law, LLP

(57) ABSTRACT

An apparatus and a method for raising a data throughput by dynamically changing the maximum number of iterative decoding times of an iteratively decodable code in a mobile communication system are provided. The apparatus includes an early stop controller for determining whether an early stop condition is satisfied during a decoding process according to a maximum number of the iterative decoding times, a Connection IDentifier (CID) controller for detecting a CID of a Media Access Control (MAC) header after the early stop, and an iteration controller for, when determining that a Protocol Data Unit (PDU) is allocated to the receiver apparatus by detecting the CID of the MAC header, resetting the maximum number of iterative decoding times after identifying a decoding block of a next PDU, and for, when the CID is not detected, resetting the maximum number of the iterative decoding times after identifying a next decoding block of the current PDU.

16 Claims, 3 Drawing Sheets

APPARATUS AND METHOD FOR CONTROLLING ITERATIVE DECODING IN A MOBILE COMMUNICATION SYSTEM

PRIORITY

This application claims the benefit under 35 U.S.C. §119 (a) of a Korean patent application filed in the Korean Intellectual Property Office on Oct. 30, 2007 and assigned Serial No. 2007-109402, the entire disclosure of which is hereby incorporated by reference.

BACKGROUND OF THE INVENTION

1. Field of the Invention

The present invention relates to an apparatus and a method for decoding a channel code in a mobile communication system. More particularly, the present invention relates to an apparatus and a method for raising a data throughput by dynamically changing a maximum number of iterative decoding times of a channel code iteratively decodable in a mobile communication system.

2. Description of the Related Art

Mobile communications systems can raise data transmission efficiency by changing a data rate based on a channel condition using iteratively decodable codes such as turbo codes and Low Density Parity Check (LDPC) codes.

In the coding using the iterative decoding, the preset maximum number of iterative decoding times is important. The maximum number of the iterative decoding times is a factor in determining a decoding throughput of the entire system.

When determining that the output of a decoder is reliable prior to reaching the maximum number of the iterative decoding times during the data decoding process, the mobile communication system performs an early stopping algorithm which aborts the decoding process without decoding up to the maximum number of the iterative decoding times. The early stopping algorithm is explained in detail below with reference to FIGS. 1A and 1B.

FIG. 1A depicts a conventional frame structure of a mobile communication system.

The frame structure of FIG. 1A includes MAP information 110 and bursts 112. The MAP information 110, which is allocation information of the data bursts 112, includes information for determining the maximum number of the iterative decoding times of a frame. The MAP information 110 is contained at the head of the frame.

A receiver can acquire data on the current frame upon decoding the MAP information 110. Based on a decoding rate of the receiver, an upper bound of the number of the iterative decoding times can be calculated.

The burst 112 includes a plurality of Protocol Data Units (PDUs) 114. Each PDU 114 includes a MAC header 116 and may include a payload 118.

The MAC header 116 carries information relating to a size of the PDU 114. The size of the PDU 114 differs per PDU. The receiver can acquire the size of the payload 118 from the size of the PDU 114 of the MAC header 116. The payload 118 may include CRC information 120 for error checking.

The MAP information 110 delivers the MAP using a preset modulation scheme and a preset code rate. Alternatively, by dividing the MAP, the first MAP is transmitted using a preset modulation scheme and a preset code rate to inform of the modulation scheme and the code rate of a subsequent MAP.

The receiver decodes the frame by setting the maximum number of the iterative decoding times of the frame based on the MAP information 110 of the frame. When setting the maximum number of the iterative decoding times, the receiver needs to assume a worst case where the early stopping is not performed.

FIG. 1B depicts the conventional MAC header 116 of the PDU 114.

In the first row, the MAC header 116 of FIG. 1B includes a 1-bit HT field 130 indicative of a header type, a 1-bit EC field 132 indicative of encryption control, and a 6-bit Type field 134 indicative of a payload type. Herein, the HT field 130 of '0' indicates a MAC header and '1' indicates a band request header. The EC field 132 of '0' indicates a non-encrypted payload and '1' indicates an encrypted payload.

The first row of the general MAC header includes 1-bit reserved (Rsv) fields 136 and 142, a 1-bit CI field 138 indicative of the CRC check, a 2-bit EKS field 140 indicative of an encryption key sequence, and Most Significant Bit (MSB) 3 bits of a LEN field 144 indicative of a bytewise length of the MAC PDU including the MAC header. The second row of the general MAC header includes Least Significant Bit (LSB) 8 bits 146 of the LEN field and MSB 8 bits 150 of a CID field indicative of a Connection IDentifier (CID). The third row includes LSB 8 bits 148 of the CID field and an 8-bit HCS field 152 indicative of a header check sequence.

The receiver can determine whether the PDU is allocated to the receiver by checking the CID information of the MAC header and thereby may process to abort the decoding. Thus, the early stopping can be achieved by reducing the number of the iterative decoding times.

After determining the maximum number of the iterative decoding times using the MAP information, the receiver aborts the decoding according to the early stopping condition. Next, the receiver can determine whether to abort the decoding on the PDU based on the information (CID) of the MAC header and execute the early stopping and the decoding abortion based on the MAC header (CID) at the same time.

However, when the decoding is terminated before the scheduled time, the above-mentioned method cannot change the maximum number of the iterative decoding times in the frame. That is, when the decoding is completed earlier than scheduled, a demodulator is idle during the remaining time. Therefore, a conventional iterative decoding controller cannot attain sufficient iterative decoding gain.

SUMMARY OF THE INVENTION

An aspect of the present invention is to address at least the above-mentioned problems and/or disadvantages and to provide at least the advantages described below. Accordingly, an aspect of the present invention is to provide an apparatus and a method for raising a data throughput of a mobile communication system.

Another aspect of the present invention is to provide an apparatus and a method for dynamically changing the maximum number of iterative decoding times to enhance a data throughput of a mobile communication system.

In accordance with an aspect of the present invention, a receiver apparatus for resetting a maximum number of iterative decoding times is provided. The apparatus includes an early stop controller for determining whether an early stop condition is satisfied during a decoding process according to a maximum number of the iterative decoding times, a Connection IDentifier (CID) controller for detecting a CID of a Media Access Control (MAC) header after the early stop, and an iteration controller for, when determining that a Protocol Data Unit (PDU) is allocated to the receiver apparatus by detecting the CID of the MAC header, resetting the maximum number of iterative decoding times after identifying a decoding block of a next PDU, and for, when the CID is not detected, resetting the maximum number of the iterative decoding times after identifying a next decoding block of the current PDU.

In accordance with another aspect of the present invention, a method for resetting a maximum number of iterative decoding times at a receiver is provided. The method includes after performing an early stop during a decoding process according to a maximum number of iterative decoding times, determining whether a Protocol Data Unit (PDU) is allocated to a receiver apparatus according to whether a Connection IDentifier (CID) of a Media Access Control (MAC) header is detected, when it is determined that the PDU is allocated to the receiver apparatus by detecting the CID of the MAC header, resetting the maximum number of iterative decoding times for decoding a next PDU, and when it is determined that the PDU is not allocated to the receiver apparatus by not detecting the CID of the MAC header, determining whether every decoding block is decoded, and if every decoding block has not been detected, identifying a next decoding block of the PDU and resetting the maximum number of iterative decoding times.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments the present invention will become more apparent from the following description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

Exemplary embodiments of the present invention provide an apparatus and a method for dynamically changing the maximum number of iterative decoding times to raise a data throughput of a mobile communication system.

Figure 1A:
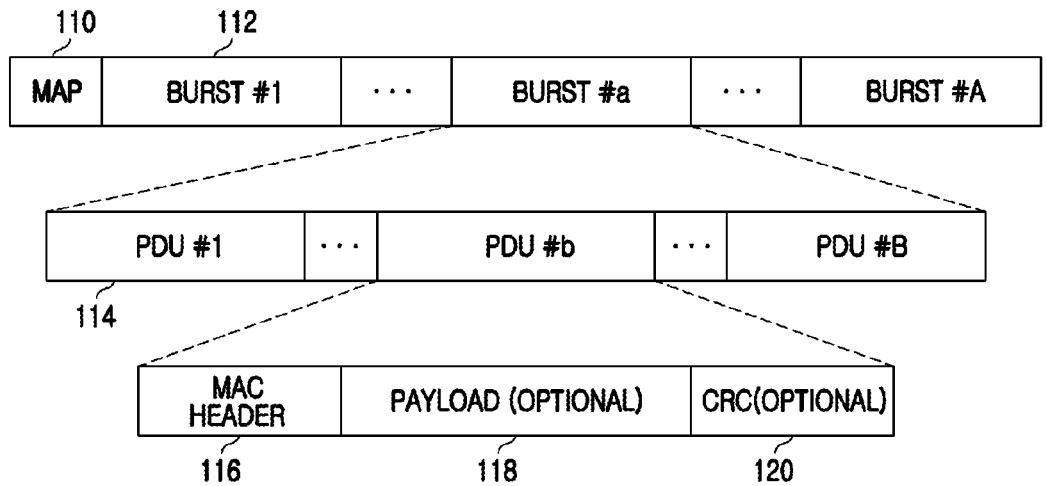
FIG. 1A illustrates a conventional frame structure of a mobile communication system.
Figure 1B:
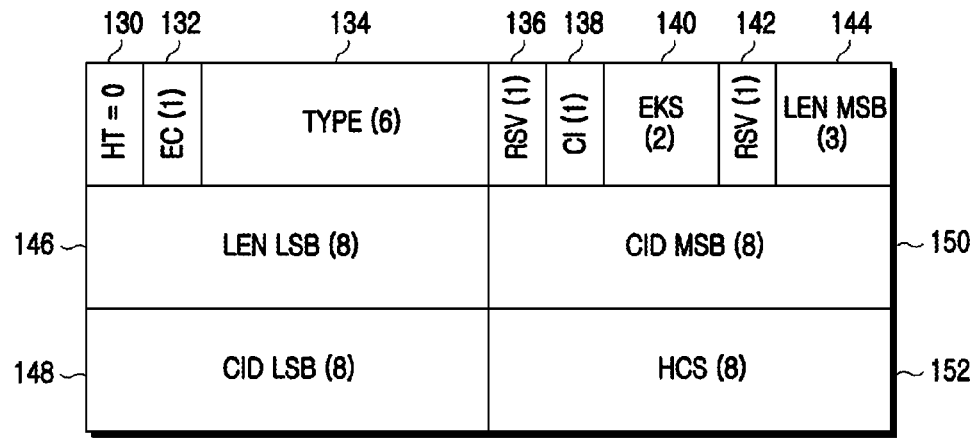
FIG. 1B illustrates a Media Access Control (MAC) header of a conventional Protocol Data Unit (PDU)
Figure 2:
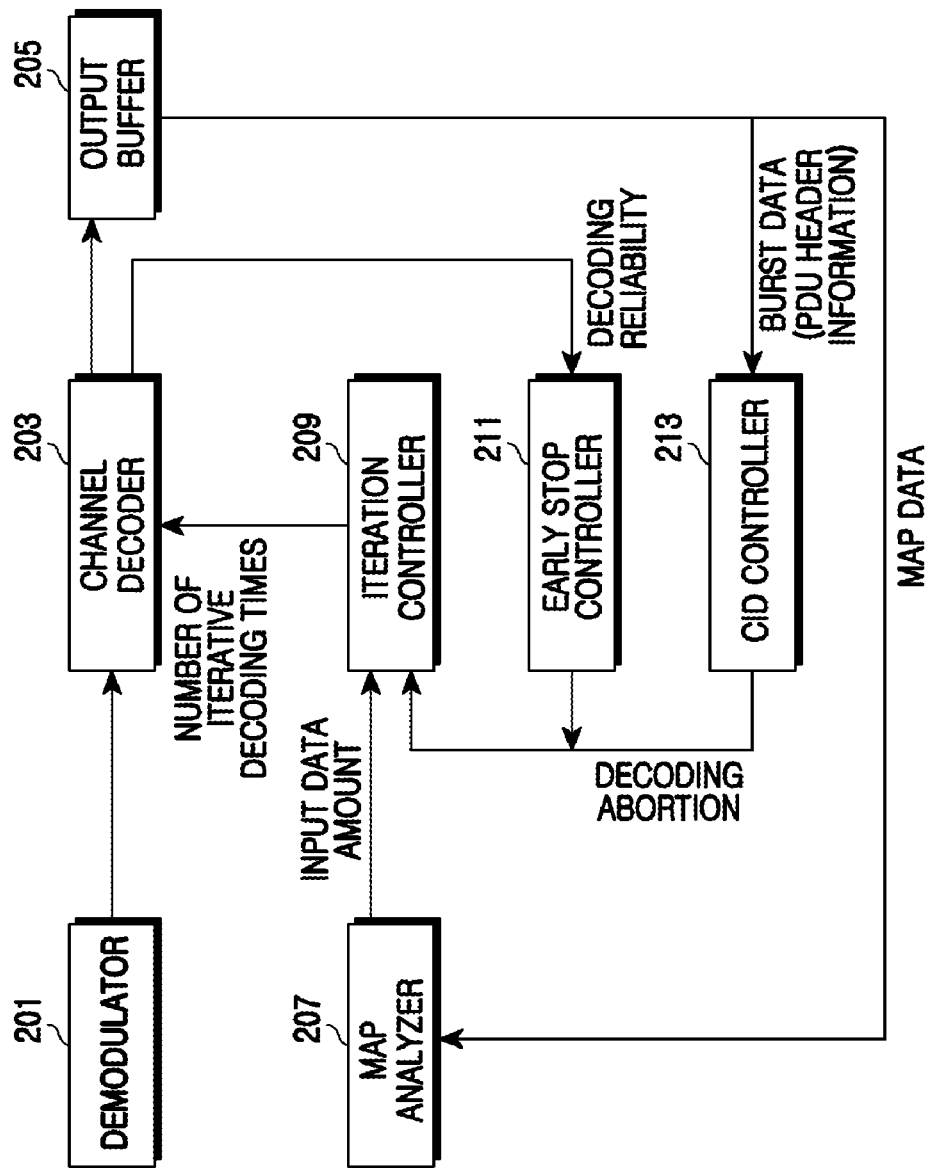
FIG. 2 illustrates a receiver for dynamically setting a maximum number of iterative decoding times according to an exemplary embodiment of the present invention.

FIG. 2 illustrates a block diagram of a receiver for dynamically setting a maximum number of iterative decoding times according to an exemplary embodiment of the present invention.

The receiver of FIG. 2 includes a demodulator 201, a channel decoder 203, an output buffer 205, a MAP analyzer 207, an iteration controller 209, an early stop controller 211, and a Connection IDentifier (CID) controller 213. The channel decoder 203, the early stop controller 211, and the CID controller 213 of FIG. 2 may represent any number of blocks.

The MAP analyzer 207 of the receiver determines information on the bursts to be decoded in a designated interval or in a frame, that is, the amount of data allocated to the bursts by analyzing the MAP information. The iteration controller 209 determines the number of the iterative decoding times of the channel decoder 203 based on the total amount of the burst data fed from the MAP analyzer 207.

The channel decoder 203 receives the information on the maximum number of the iterative decoding times from the iteration controller 209, decodes the demodulated data frame output from the demodulator 201, and outputs the decoded data to the output buffer 205.

The output buffer 205 extracts the MAP data, that is, the control information from the decoded data output from the channel decoder 203 and provides the extracted data to the MAP analyzer 207.

The iteration controller 209 determines the number of the iterative decoding times of the channel decoder 203 based on the total data amount provided from the MAP analyzer 207. When receiving information relating to the decoding abortion from the early stop controller 211 and the CID controller 213 in the process of the frame decoding, the iteration controller 209 controls to dynamically reset the number of the iterative decoding times using the received information.

The channel decoder 203 receives the information of the maximum number of the iterative decoding times from the iteration controller 209 and performs the iterative decoding until the maximum number of the iterative decoding times is reached.

The early stop controller 211 determines whether to abort the iterative decoding by determining the decoding reliability of the channel decoder 203. When the CID controller 213 can read the PDU header information of the decoded data block, it reads the CID information of the header information and determines whether to abort the decoding of the block of the PDU.

Figure 3:
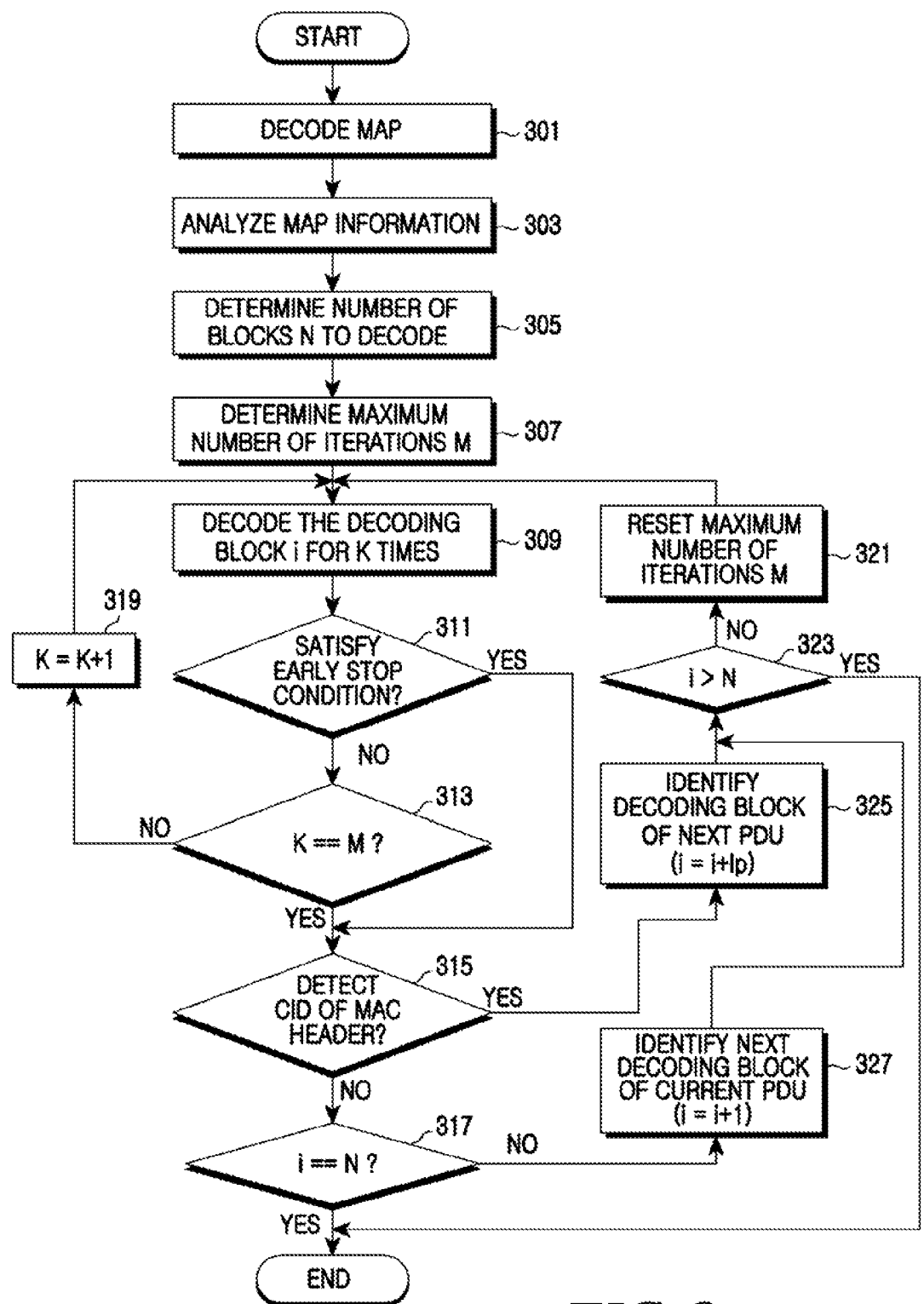
FIG. 3 illustrates a method for resetting a maximum number of iterative decoding times at a receiver according to an exemplary embodiment of the present invention.

FIG. 3 illustrates a flowchart illustrating a method for resetting a maximum number of iterative decoding times at a receiver according to an exemplary embodiment of the present invention.

After decoding the MAP of the frame in step 301, the receiver controls the MAP analyzer 207 to analyze the MAP information in step 303. Herein, the MAP analyzer 207 can acquire the information on the bursts to be decoded in a preset interval or in the frame, that is, the amount of the data allocated to the bursts by analyzing the MAP information.

After determining the number of blocks N to decode in step 305, the receiver controls the iteration controller 209 to determine the maximum number of the iterative decoding times M of the decoder 203 based on the data amount provided from the MAP analyzer 207 in step 307.

Next, the receiver processes to decode the decoding blocks in sequence. For doing so, the receiver controls the channel decoder 203 to decode a decoding block i (herein, i indicates a sequence number of the current decoding block) for K times (herein, K indicates the number of decoding times and is '1' at the initial decoding operation) in step 309. In step 311, the receiver controls the early stop controller 211 to determine whether the early stop condition is satisfied.

When the early stop condition is not satisfied, the receiver determines whether the number of the decoding times K is equal to the maximum number of the iterative decoding times M (K==M) in step 313.

When the number of the decoding times K is different from the maximum number of the iterative decoding times M, the receiver increases the number of the decoding times K by one in step 319 and returns to step 309. When the number of the decoding times K is equal to the maximum number of the iterative decoding times M, the receiver controls the CID controller 213 to determine whether it can detect the CID of the MAC header in step 315.

When the early stop condition is satisfied in step 311, the receiver controls the channel decoder 203 to abort the decoding on the corresponding decoding block and then proceeds to step 315.

Determining that the PDU is allocated to the receiver by detecting the CID of the MAC header in step 315, the receiver identifies a decoding block of the next PDU in step 325. Herein, the next decoding block can be selected by adding the number $1p$ of the remaining decoding blocks of the current PDU and the sequence number i of the current decoding block to skip to the next PDU through the MAC header examination.

In step 323, the receiver determines whether there is a next PDU, that is, whether the sequence number i of the current decoding block is greater than the number of the decoding blocks N (i>N). When the sequence number i of the current decoding block is greater than the number of the decoding blocks N, the receiver finishes the decoding process.

In contrast, when there is no next PDU, that is, when the sequence number i of the current decoding block is smaller than the number of the decoding blocks N (i<N), the receiver controls the iteration controller 209 to reset the maximum number of the iterative decoding times M in step 321 and goes back to step 309. Herein, under the control of the receiver, the iteration controller 209 can reset the maximum number of the iterative decoding times M based on Equation (1).

$$M = \left\lfloor \frac{F - C_t - BN_t - R}{IN_t} \right\rfloor \quad (1)$$

In Equation (1), B denotes a time taken to store the demodulated symbols to the output buffer, I denotes a time taken to decode the current block for one time, F denotes a time when the decoding process is ended, $C_t$ denotes a time when the current maximum number of the iterative decoding times is calculated, $N_t$ denotes the number of remaining blocks to decode at the current time point $C_t$, and R denotes an additional amount of time required to calculate the maximum number of the iterations.

As described above, the maximum number of the iterative decoding times M is calculated using the relationships between the remaining data amount, the remaining time for the decoding, and the decoding processing rate. Although the expression may differ according to the modeling scheme of the above elements in some degree, the basic calculation is still the same.

When determining that the PDU is not allocated to the receiver because the CID of the MAC header is not detected in step 315, the receiver determines whether every decoding block is decoded in step 317. In other words, the receiver determines whether the sequence number i of the decoding blocks to decode is equal to the number of the blocks to decode N in step 317.

When every decoding block is not yet decoded, the receiver identifies a next decoding block of the current PDU in step 327 and proceeds to step 323. Herein, the next decoding block can be identified by increasing the sequence number i of the current decoding block by one. Next, the receiver controls the iteration controller 209 to reset the maximum number of the iterative decoding times M in step 321.

In contrast, when every decoding block is decoded completely, the receiver finishes the process.

As set forth above, the data throughput can be enhanced by dynamically setting the maximum number of the iterative decoding times M based on the decoding time-varying factors such as early stop control or CID control. Namely, at a high data rate in the good channel condition, the data throughput is raised by decreasing the number of the iterations. Under a poor channel condition, the number of the iterations is increased up to the maximum number of the iterative decoding times to acquire the optimum performance. Therefore, the deterioration of the channel estimation in the frame rear part, rather than in the frame front part, can be addressed.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A receiver apparatus for resetting a maximum number of iterative decoding times, the receiver apparatus comprising:
    an early stop controller for determining whether an early stop condition is satisfied during a decoding process according to the maximum number of the iterative decoding times;
    a Connection IDentifier (CID) controller for detecting a CID of a Media Access Control (MAC) header after the early stop occurs; and
    an iteration controller for, when determining that a Protocol Data Unit (PDU) is allocated to the receiver apparatus by detecting the CID of the MAC header, resetting the maximum number of the iterative decoding times after identifying a decoding block of a next PDU, and for, when the CID is not detected, resetting the maximum number of the iterative decoding times after identifying a next decoding block of a current PDU.

2. The receiver apparatus of claim 1, wherein the iteration controller resets the maximum number of the iterative decoding times using information from at least one of the early stop controller and the CID controller.

3. The receiver apparatus of claim 1, wherein, upon detecting the CID of the MAC header, the decoding block of the next PDU is identified by adding a number of remaining decoding blocks of the current PDU based on the CID and a sequence number of a current decoding block.

4. The receiver apparatus of claim 3, wherein, when the number of remaining decoding blocks of the current PDU based on the CID and the sequence number of the current decoding block is greater than a number of blocks to be decoded, the decoding process is terminated without resetting the maximum number of the iterative decoding times.

5. The receiver apparatus of claim 1, wherein, when every decoding block of the current PDU is not decoded, the next decoding block is identified by increasing a sequence number of a current decoding block by one.

6. The receiver apparatus of claim 5, wherein, when the sequence number of the current decoding block that is increased by one is greater than a number of blocks to be decoded, the decoding process is terminated without resetting the maximum number of the iterative decoding times.

7. The receiver apparatus of claim 2, wherein the iteration controller resets the maximum number of the iterative decoding times by taking into account at least one of a remaining data amount when the maximum number of the iterative decoding times is calculated, a remaining decodable time, and a speed of a decoder.

8. The receiver apparatus of claim 7, wherein the iteration controller resets the maximum number of the iterative decoding times based on the following equation:

$$M = \left\lfloor \frac{F - C_t - BN_t - R}{IN_t} \right\rfloor$$

where M denotes the maximum number of the iterative decoding times, B denotes a time taken to store demodulated symbols to an output buffer, I denotes a time taken to decode a current block for one time, F denotes a time when a decoding process is ended, $C_t$ denotes a time when a current maximum number of the iterative decoding times is calculated, $N_t$ denotes a number of remaining blocks to decode at a current time point $C_t$, and R denotes an additional amount of time required to calculate a number of the iterations.

9. A method for resetting a maximum number of iterative decoding times at a receiver apparatus, the method comprising:
 after performing an early stop during a decoding process according to the maximum number of the iterative decoding times, determining whether a Protocol Data Unit (PDU) is allocated to the receiver apparatus according to whether a Connection IDentifier (CID) of a Media Access Control (MAC) header is detected;
 when it is determined that the PDU is allocated to the receiver apparatus by detecting the CID of the MAC header, resetting the maximum number of the iterative decoding times for decoding a next PDU; and
 when it is determined that the PDU is not allocated to the receiver apparatus by not detecting the CID of the MAC header, determining whether every decoding block is decoded, and, if every decoding block has not been detected, identifying a next decoding block of the PDU and resetting the maximum number of the iterative decoding times.

10. The method of claim 9, wherein the maximum number of the iterative decoding times is reset using at least one of the early stop information and CID information.

11. The method of claim 9, wherein, when the CID of the MAC header is detected, the resetting of the maximum number of the iterative decoding times comprises:
 determining a number of remaining decoding blocks of the PDU based on the CID; and
 adding the number of the remaining decoding blocks and a sequence number of a current decoding block.

12. The method of claim 11, wherein, when the number of remaining decoding blocks of the PDU based on the CID and the sequence number of the current decoding block is greater than a number of blocks to be decoded, the decoding process is terminated without resetting the maximum number of the iterative decoding times.

13. The method of claim 9, wherein, when the CID of the MAC header is not detected, the resetting of the maximum number of the iterative decoding times comprises increasing a sequence number of a current decoding block by one.

14. The method of claim 13, wherein, when the sequence number of the current decoding block that is increased by one is greater than a number of blocks to be decoded, the decoding process is terminated without resetting the maximum number of the iterative decoding times.

15. The method of claim 10, wherein the maximum number of the iterative decoding times is reset by taking into account at least one of a remaining data amount when the maximum number of the iterative decoding times is calculated, a remaining decodable time, and a speed of a decoder.

16. The method of claim 15, wherein the maximum number of the iterative decoding times is reset based on the following equation:

$$M = \left\lfloor \frac{F - C_t - BN_t - R}{IN_t} \right\rfloor$$

where M denotes the maximum number of the iterative decoding times, B denotes a time taken to store demodulated symbols to an output buffer, I denotes a time taken to decode a current block for one time, F denotes a time when a decoding process is ended, $C_t$ denotes a time when a current maximum number of the iterative decoding times is calculated, $N_t$ denotes a number of remaining blocks to decode at a current time point $C_t$, and R denotes an additional amount of time required to calculate a number of the iterations.

* * * * *